(12) United States Patent
Pichot et al.

(10) Patent No.: US 9,291,730 B2
(45) Date of Patent: Mar. 22, 2016

(54) STRESS-RELIEF DEVICE FOR GEOPHYSICAL EQUIPMENT OR NODE

(71) Applicant: SERCEL, Carquefou (FR)

(72) Inventors: Yann Pichot, Orvault (FR); Johann Dabouineau, Villeneuve de Riviere (FR); Simon Gambini, Capvern (FR)

(73) Assignee: SERCEL, Carquefou (FR)

( * ) Notice: Subject to any disclaimer, the term of this patent is extended or adjusted under 35 U.S.C. 154(b) by 341 days.

(21) Appl. No.: 13/725,090

(22) Filed: Dec. 21, 2012

(65) Prior Publication Data

US 2013/0163384 A1   Jun. 27, 2013

(30) Foreign Application Priority Data

Dec. 22, 2011 (EP) .................................... 11306760

(51) Int. Cl.
*G01V 1/20* (2006.01)
*G01V 1/18* (2006.01)
*B81B 3/00* (2006.01)

(52) U.S. Cl.
CPC ........ *G01V 1/18* (2013.01); *G01V 1/181* (2013.01); *G01V 1/20* (2013.01); *B81B 3/0072* (2013.01); *G01V 1/201* (2013.01)

(58) Field of Classification Search
USPC .................................................. 367/177, 188
See application file for complete search history.

(56) References Cited

U.S. PATENT DOCUMENTS

| | | | | |
|---|---|---|---|---|
| 3,119,978 | A | | 1/1964 | Sears |
| 3,931,453 | A | | 1/1976 | Hall, Jr. |
| 3,993,859 | A | * | 11/1976 | McNeel .......................... 367/188 |
| 4,117,449 | A | | 9/1978 | McNeel |
| 5,130,954 | A | | 7/1992 | Fussell |
| 5,259,597 | A | * | 11/1993 | Fredheim ......................... 367/20 |
| 5,297,974 | A | | 3/1994 | Fussell |
| 6,786,297 | B1 | | 9/2004 | Menard |
| 2006/0117874 | A1 | * | 6/2006 | Goujon et al. ................. 367/141 |

OTHER PUBLICATIONS

European Search Report and Written Opinion dated Aug. 2, 2012 for corresponding European Application No. 11306760.7, filed Dec. 22, 2011.

* cited by examiner

*Primary Examiner* — Ian J Lobo
(74) *Attorney, Agent, or Firm* — David D. Brush; Westman, Champlin & Koehler, P.A.

(57) ABSTRACT

A stress-relief device is provided, which is configured for being mounted on a geophysical equipment or node connected to at least two cables. The device includes a case configured for surrounding the geophysical equipment or node and for making at least an opening for enabling a connection between each of the at least two cables and the geophysical equipment or node. The device also includes a housing for housing a portion of each of the two cables, the housing being configured for substantially preventing any movement of said portions of the two cables.

14 Claims, 3 Drawing Sheets

STRESS-RELIEF DEVICE FOR GEOPHYSICAL EQUIPMENT OR NODE

CROSS-REFERENCE TO RELATED APPLICATIONS

None.

STATEMENT REGARDING FEDERALLY SPONSORED RESEARCH OR DEVELOPMENT

None.

THE NAMES OF PARTIES TO A JOINT RESEARCH AGREEMENT

None.

FIELD OF THE DISCLOSURE

The present disclosure relates to geophysical equipment, especially in the field of seismic prospection and seismic data acquisition. More specifically, the disclosure relates to seismic data acquisition systems comprising a cabled network connected to a central processing unit, for example onboard a vehicle.

The disclosure particularly relates to the seismic prospecting method for oil industry, but may be applied to any field implementing a seismic data acquisition network. However, one particular application of the disclosure relates to land seismic data acquisition systems.

In the field of the disclosure, seismic data acquisition operations in the field conventionally use networks of electronic units whereto geophysical (or seismic) sensors are connected.

In an embodiment, these sensors, generally referred to using the term geophones, are generally interconnected in groups of sensors by cables to form clusters referred to as "strings". One or a plurality of these strings are connected to said electronic units. The electronic units, interconnected by a cabled digital network, perform the analog to digital conversion of the signal from the groups of sensors. In another embodiment, the sensors are of the digital kind, the signals they send to the electronic units being already digital.

In both embodiments, the electronic units send these data to the recording truck via said digital network, a central data processing unit being onboard the truck.

To collect the geophysical data, one or a plurality of seismic sources in contact with the ground are activated to propagate omnidirectional seismic wave trains. The sources may among other things consist of explosives, falling weights, vibrators or air guns in marine environments.

The wave trains reflected by the layers of the subsurface are detected by the sensors, which generate an analog signal characterising the reflection of the waves on the geological interfaces of the subsurface.

As specified above, the disclosure particularly applies to seismic data acquisition system implementing a cabled network.

In this type of network, the data are conventionally sent from the digital unit to the central processing unit via electronic modules.

These electronic modules perform different functions, including:
power supply of the units via batteries;
synchronisation of the units;
processing of the signal and the interface with the digital network (transfer of data to the central processing unit, sending of commands received from the central processing unit to the units).

Land seismic operations take place in three kinds of areas or zones:
dry areas, in which there are very low tensile stress, and for which the equipment comprising cables and electronic modules is required to have a watertightness down to 1 m deep;
marsh areas, in which there are low tensile stress and for which the equipment is required to have a high robustness and a watertightness down to 5 m deep;
transition areas, in which there are high tensile stress and bending stress, and for which the equipment is required to have high robustness and watertightness up to 15 m deep.

Geophysical equipment is generally used in dry and marsh areas for about 95% of the land operations.

The equipment for these aforementioned land operations comprise cables which may be chosen between two different qualities of cables. A first basic cable comprises longitudinal paid off aramid strength member under a single thermoplastic jacket. A second high-performance cable comprises at least one aramid braid in between two thermoplastic jackets. The second high-performance cable is more adapted to resist to:
passage of animals (rodents, ruminants, etc . . . );
vandalism;
passage of vehicle wheels

BACKGROUND OF THE DISCLOSURE

In case of getting through a transition area during land operation, it is necessary to protect geophysical equipment such as electronic modules or nodes from tensile stress.

It is known to add a rope for joining together two points of a cable on each side of a geophysical equipment such as an electronic module or a node, so that the length of the rope is shorter than the distance between the two points along the cable and the geophysical equipment. Such method creates a diversion for tensile stress through the rope, creating a stress relief in the geophysical equipment and therefore protecting it. In case of three cables connected to a geophysical equipment, one of the cable, herein called the third cable, being connected directly or indirectly to a seismic sensor, such as a geophone, two ropes may be used for linking the third cable to respectively each of the two other cables, so as to protect the geophysical equipment.

A drawback of such a system with ropes is that it is insufficient and not reliable. Indeed, if the loop formed by the rope(s), which is quite big, is stressed for example by underwater debris, the corresponding tensile stress may then be communicated to the geophysical equipment itself, which may consequently lose its watertightness.

Furthermore, if the seismic sensor or third cable is stressed for example by underwater debris, the corresponding bending stress is communicated to the geophysical equipment itself, in particular to the watertightness zones, as this system of ropes does not resolve the problems linked to bending stress.

Another drawback is that such a system with ropes weakens or even damages the cables at the points at which the ropes are fixed, because of the tightly encirclement of the cables at these points.

Another known stress-relief device, as disclosed in U.S. Pat. No. 6,786,297, is adapted to high-performance cables and is very expensive, being manually incorporated during manufacturing of the equipment. This device, included in the equipment, is specifically manufactured for creating a diversion of tensile stress. Thus, the costs due to this device are very high for a use of only 5% of land operations in transition areas.

SUMMARY

An embodiment of the present disclosure relates to a stress-relief device, configured for being mounted on a geophysical equipment, such as an electronic module, or node, connected to at least two cables, preferably two cables, each being also connected to another geophysical equipment or node, for example.

According to an exemplary embodiment, the stress-relief device comprises:
- a case, in particular a stiff case, configured for surrounding the geophysical equipment or node, and for making at least an opening for enabling a connection between each of the at least two cables and the geophysical equipment or node,
- a housing for housing a portion of each of the two cables, the housing being configured for substantially preventing any movement of said portions of the two cables.

The stress-relief device is therefore configured for enabling the passage of tensile stress, in the housing, from one of the two cables to the other one without passing through the geophysical equipment or node.

The housing is therefore the location of the transfer of tensile stress from one cable to the other, thanks to the compression of the two cables in their portions housed in the housing.

The opening(s) are for example positioned on a same face of the case so that the two cables are spaced enough between one another to allow the cables to go through the housing being parallel to one another and coming from opposite directions. The case may for example comprise lateral faces, which are opposite or not, each of them comprising an opening for enabling the connection of one cable. In another embodiment, the case may comprise a face comprising two openings for enabling the connection of the two cables, the openings being spaced enough between them.

Thanks to an embodiment of the disclosure, there is provided a high-performance and reliable stress-relief device protecting a geophysical equipment or node from tensile stress, which improves the watertightness and robustness of the equipment.

Furthermore, the stress-relief device may be used with a kind of cable, such as a basic cable or a high-performance cable, or with another cable, preferably with high-performance cable. The housing is adapted to the diameter and material of such cable so as to substantially prevent any movement of the housed portions of the two cables.

Moreover, the stress-relief device may be industrially manufactured with few manual work, thus reducing the costs.

Another advantage of an exemplary embodiment is to provide a device with small loops of cables in comparison with the big loops of the prior art, thereby reducing the risk of bumping the loops during operation.

In an embodiment, the housing is configured so that the two cables cross one another in the housing, being substantially parallel to one another in the housing.

The housing comprises for example at least one pipe, preferably two pipes, that are preferably parallel to one another, the or each pipe comprising two ends and being opened at its ends, the or each pipe being configured for housing at least one of said portions of the two cables. The pipe(s) may be made in a stiff material. The pipe(s) may for example comprise grooves, preferably comprising reliefs forming for example rings or bumps, so as to tightly contact the concerned portion of the cable. Such compression of the cables acts for the transfer of tensile stress from one cable to the other one, through the stress-relief device.

The housing may comprise at least one soft piece, in particular two soft pieces, for surrounding at least part of at least one of the portions of the two cables to be housed. The presence of soft piece(s) may spread the compression of the cables in the housing, thereby preventing them from damage, the compression of the cables not being made in only one point of the cable but spread along the whole part of the cable surrounded by the soft piece. The soft piece(s) may be housed in a portion of the pipe(s), preferably in the vicinity of at least one of the ends of the pipe(s), so as to spread the compression of the cables at the point at which the tensile stress is applied to the cable. One soft piece may be housed in two pipes. The housing may comprise two soft pieces, each of them being disposed proximal to an end of the pipe(s).

The soft piece(s) may comprise a polyurethane material, or a silicone material or another soft material such as rubber. The hardness of the soft piece(s) may be lower than 80 Shore A, for example in the range 40 to 80 Shore A, at room temperature.

The stress-relief device may be removable from the geophysical equipment or node and from each of the two cables. Such feature advantageously enables for example to use the stress-relief device only in marsh or transition areas, i.e. when necessary. With such device, the operator can easily assemble and disassemble the stress-relief device during operation.

In a particular embodiment, the case comprises a lower face, the housing comprising the lower face or being disposed under the lower face of the case.

The case may comprise at least two opposite lateral faces, each of said opposite lateral faces forming the opening for the connection between said at least two cables and said geophysical equipment or node.

In a particular embodiment, the stress-relief device comprises at least one bend restrictor to be positioned around another portion of one of the two cables so as to prevent said another portion from bending. The at least one bend restrictor is for example positioned around said another portion of one of the cables outside the housing in the vicinity of an end of the housing, in particular in the vicinity of an end of the pipe(s). The bend restrictor protects the cable from bending, shearing and therefore from damage and breakage.

In an embodiment of the disclosure, the case comprises two half-shells to be mounted together around the geophysical equipment or node. The two-half shells are preferably substantially symmetrical relative to a plane.

The housing may comprise at least one plate intended to be fixed to the lower face of the case, for example by screwing.

The housing may further comprise at least one plate forming the lower face of the case.

The plate(s) may be made for forming the pipe(s), for example by presenting grooves, preferably with reliefs such as rings or bumps, on at least one plate.

Thanks to the plate(s) forming the housing, the stress-relief device is quite easy to assemble or disassemble for an operator, during operation, when necessary.

In a particular embodiment, the case is configured for making a passage for enabling a connection between a third cable and the geophysical equipment or node.

Such a third cable may for example be connected to a seismic sensor, such as a geophone or another sensor. Such a third cable is not housed, even partly, in the housing, in an embodiment of the disclosure.

In this case, the stress-relief device may be shaped relative to the geophysical equipment or node so as to contact it tightly and to compress it strongly, at least in the vicinity of the passage and connection of the third cable, and to loosen it at least in the vicinity of watertightness zones. Such shape allows the direct transfer of bending stress from the seismic sensor or third cable to the stress-relief device, without passing through the geophysical equipment or node. The watertightness zones of the geophysical equipment or node are therefore preserved.

Another embodiment, in combination with the above, relates to an assembly comprising:
- a stress-relief device as described above,
- a geophysical equipment, such as an electronic module, or node and
- at least two cables connected to the geophysical equipment or node.

In such an assembly, the two cables may cross under the geophysical equipment or node in the portions of the two cables that are housed in the housing and that are parallel to one another. Each of the cables forms advantageously a loop between the connection to the geophysical equipment or node and the housing.

Another embodiment, in combination with the above, relates to an acquisition line of seismic data comprising at least one assembly as described above. Such an acquisition line may comprise a "string".

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION OF ILLUSTRATIVE EMBODIMENTS

Figure 1:
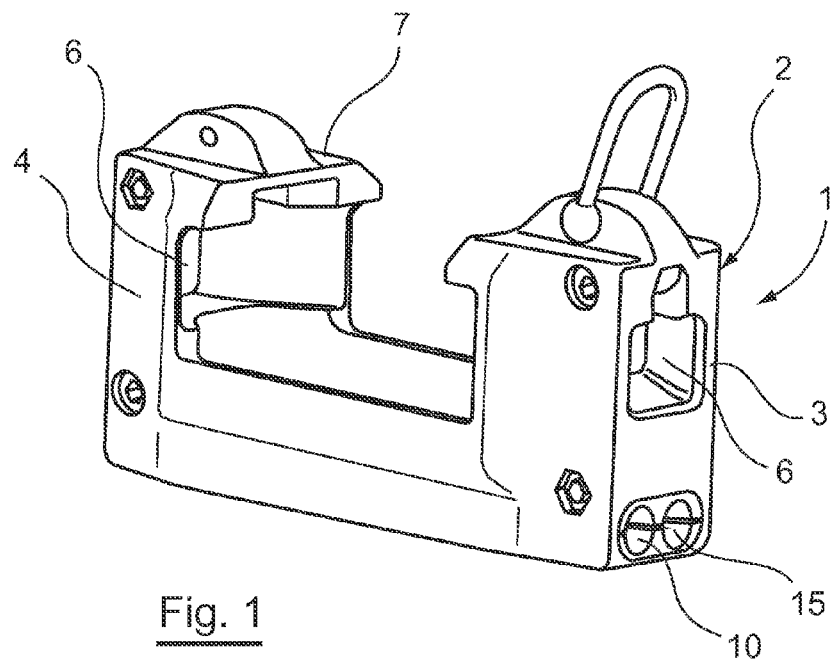
FIG. 1 is a schematic representation of a stress-relief device, in a perspective view, according to an embodiment of the disclosure.
Figure 2:
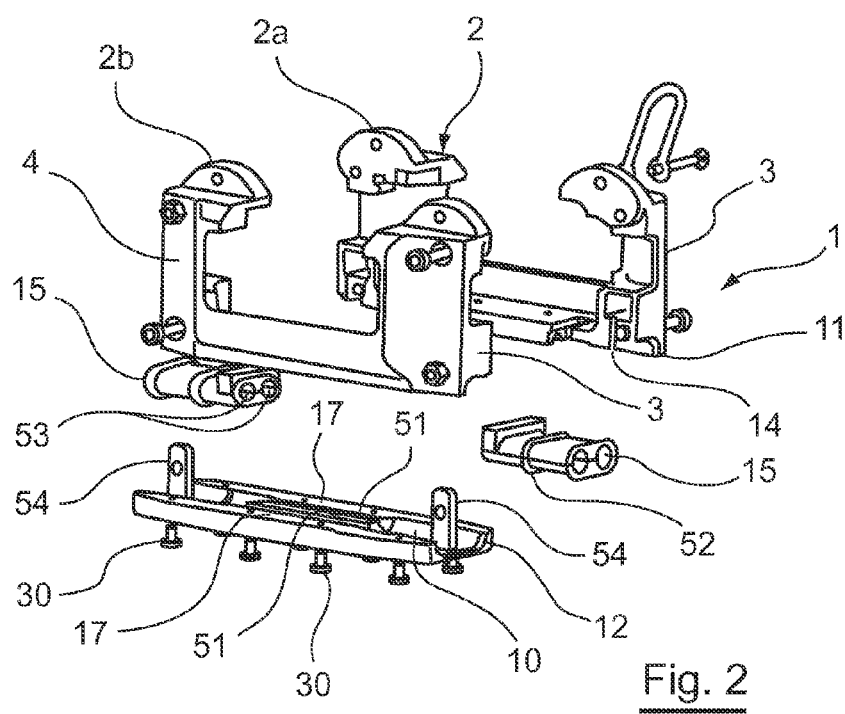
FIG. 2 is an exploded schematic view in perspective of the stress-relief device of FIG. 1.

FIGS. 1 and 2 represent the stress-relief device 1 according to an embodiment of the disclosure, configured for being mounted on a geophysical equipment or node, not represented in FIGS. 1 and 2, which is connected to at least two cables on each side of the geophysical equipment or node.

Figure 3:
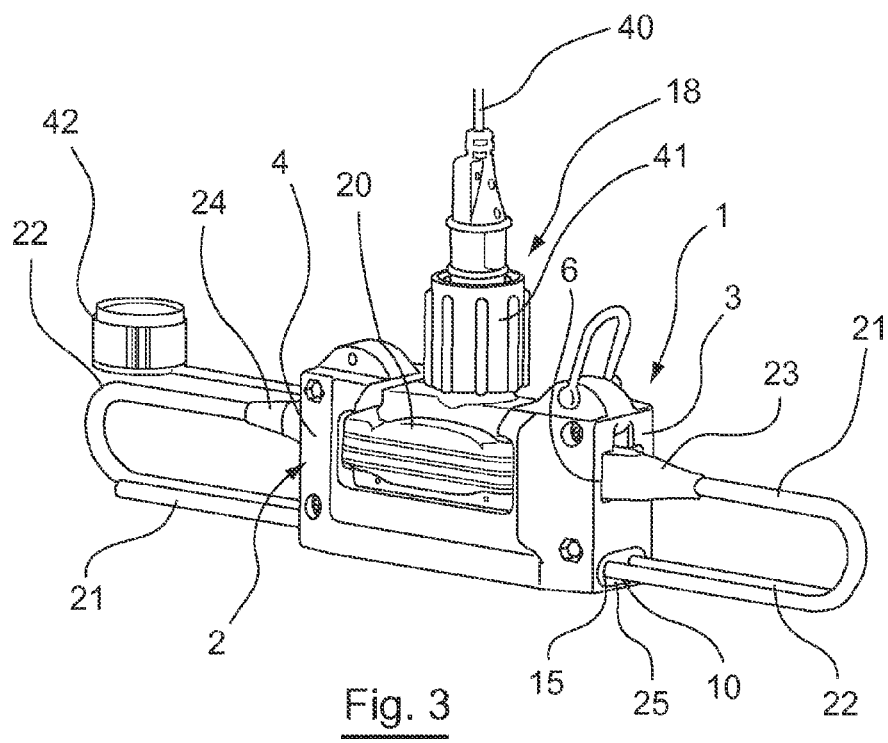
FIG. 3 is a schematic view in perspective of an assembly according to an embodiment of the disclosure.
Figure 4:
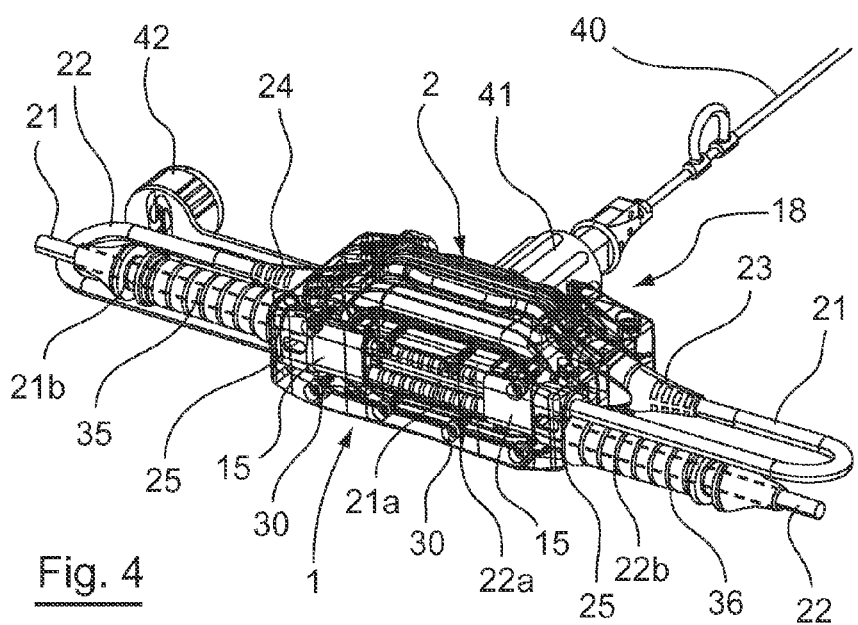
FIG. 4 is a schematic transparent view in perspective of another embodiment of the assembly according to an embodiment of the disclosure.

FIGS. 3 and 4 show an assembly 18 comprising the stress-relief device 1 of FIGS. 1 and 2 and also the geophysical equipment or node 20, which is an electronic module in this embodiment and the two cables 21 and 22 connected on the geophysical equipment 20.

The cables 21 and 22 are in this embodiment of a high-performance type, but they could be of a basic type or of another type without departing from the scope of the disclosure. The stress-relief device 1 is adapted to such cables and there is no need to change the cables when assembling or disassembling the stress-relief device 1.

According to an exemplary embodiment, the stress-relief device 1 comprises a case 2, namely a stiff case, configured for holding the geophysical equipment 20. In this embodiment, the case 2 comprises two opposite lateral faces 3 and 4. The two opposite lateral faces 3 and 4 are configured for making some space for enabling the connection by connectors 23 and 24 of the two cables 21 and 22 to the geophysical equipment 20, thanks to openings 6.

The stress-relief device 1 is quite compact and light.

In an embodiment of the disclosure, as shown in FIG. 2, the case 2 comprises two half-shells 2a and 2b to be mounted together around the geophysical equipment 20, forming together the openings 6. In this example, the half-shells 2a and 2b are substantially symmetrical relative to a vertical plane, which may be easier to connect for an operator.

The stress-relief device 1 also comprises one housing 10 as shown in FIGS. 1 and 2, for housing a portion 21a and 22a of each of the two cables 21 and 22, the housing 10 being configured for substantially preventing any movement of said portions 21a and 22a of the two cables 21 and 22.

In the embodiment shown, the housing 10 comprises two plates 11 and 12, the plate 11 forming a lower face 14 of the case 2, each half-shelf 2a and 2b comprising half of the lower face 14 and therefore half of the plate 11. The plate 12 is fixed to the case 2, in the example with several screws 30 as shown. The housing 10 is formed once the plate 12 is fixed to the case 2.

The stress-relief device 1 according to an exemplary embodiment is configured for enabling the passage of tensile stress, in the housing 10, from one of the two cables 21 or 22 to the other one without passing through the geophysical equipment 20 or node.

In the embodiment, the housing 10 is disposed relative to the case 2 so that the two cables 21 and 22 cross under the lower face 14 of the case 2, as can be seen in FIG. 3 or 4, being parallel in the housing.

In another embodiment, the openings 6 are in this example positioned on a same face of the case 2 so that the two cables 21 and 22 are spaced enough between one another to allow the cables 21 and 22 to go through the housing 10 being parallel to one another and coming from opposite directions. The openings 6 are, as described above, formed on the opposite lateral faces 3 and 4, but they may be in other faces of the case 2 or in a same face without departing from the scope of the disclosure. The case 2 could present another shape than a parallelepiped, being for example cylindrical or spherical or of another shape without departing from the scope of the disclosure.

Figure 5:
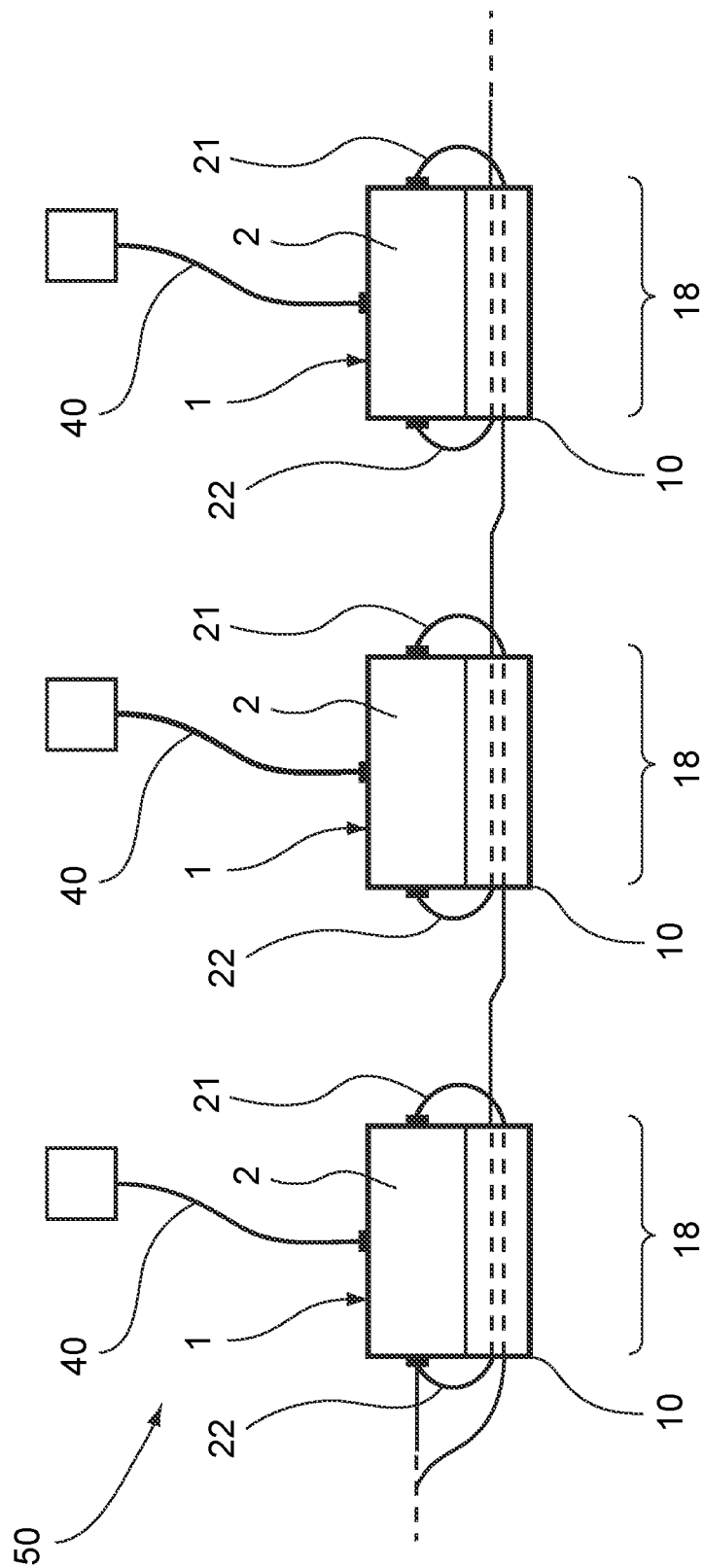
FIG. 5 is a schematic and partial view of an acquisition line of seismic data according to an embodiment of the disclosure.

As shown in FIG. 3, 4 or 5, each of the cables 21 and 22 forms a loop between the connection to the geophysical equipment or node 20 and the housing 10. As can be seen, the loops formed by the cables 21 and 22 are quite small in comparison with the loops of the prior art. The risk of bumping the loops during operation is therefore reduced.

In the embodiment shown, the housing 10 comprises two soft pieces 15, for being in contact with the portions of the two cables to be housed. The soft pieces 15 are surrounded by the two plates 11 and 12. The soft pieces 15 may comprise a polyurethane material, or a silicone material or another soft material such as rubber. The hardness of the soft pieces 15 may be lower than 80 Shore A, for example in the range 40 to 80 Shore A, at room temperature. The presence of soft pieces 15 may spread the compression of the cables in the housing, thereby preventing them from damage, the compression of the cables not being made in only one point of the cable but spread along the whole part of the cable surrounded by the soft piece. In the example shown, the soft pieces present a slot 52 along its whole length, facilitating the positioning of the cables. In this example, the soft pieces 15 comprise two ducts 53, each duct 53 being configured for housing a portion of cable.

The housing 10 comprises in this example two parallel pipes 17, each pipe 17 being configured for housing the portion 21a or 22a of one of the two cables 21 or 22. Each of the pipes 17 present two ends 25 forming openings for allowing the passage of the cables 21 and 22 in the housing. The pipes 17 house in this example in a portion the soft pieces 15. In this example, the pipes 17 present grooves 51 formed in the plates 11 and 12 for housing the portions 21a or 22a and spaces for housing the two soft pieces 15, as shown. Each space comprises a lug 54 for the fixation of the corresponding soft piece 15 and an end 25 of the pipe. In this embodiment, the pipes 17 are formed once the plate 12 is fixed to the case 2.

The stress-relief device 1 is removable from the geophysical equipment 20 or node and from the two cables 21, thanks to fixation means such as screws 30 and fixation means that fix the two half-shells 2a and 2b together. An operator is able to assemble the assembly or disassemble, when necessary, for example in transition areas, during land operations.

As shown in the embodiment of FIG. 4, the stress-relief device 1 comprises two bend restrictors 35 and 36 to be positioned around another portion 21b and 22b of the cables 21 and 22 so as to prevent said another portion 21b or 22b from bending and therefore damaging.

In this example, each bend restrictor 35 and 36 is positioned around said another portion 21b and 22b of one of the cables 21 and 22 outside the housing 10 in the vicinity of an end 25 of the housing 10 corresponding to an end 25 of the pipes 17.

In the embodiment, the case 2 comprises an upper face 7 opposite to the lower face 14, said upper face 7 being configured for enabling a third connection of a third cable 40 onto the geophysical equipment 20 or node. The third cable 40 is connected to the geophysical equipment with a connector 41 and not housed in the housing 10. In this case, the stress-relief device is shaped relative to the geophysical equipment or node so as to contact it tightly and to compress it strongly, at least in the vicinity of the passage and connection of the third cable 40, and to loosen it at least in the vicinity of watertightness zones. Such shape allows the direct transfer of bending stress from the seismic sensor or third cable 40 to the stress-relief device 1, without passing through the geophysical equipment 20 or node. The watertightness zones of the geophysical equipment or node are therefore preserved.

As shown in FIGS. 3 and 4, when the connector 41 is removed, a lid 42 attached to the geophysical equipment 20 is to be mounted on the geophysical equipment for replacing the connector 41 and protect the geophysical equipment.

FIG. 5 shows an example of part of an acquisition line 50 of seismic data, comprising a string, comprising a plurality of assemblies 18. The cabled network for a land seismic operation may comprise several acquisition lines 50.

In this example, all the geophysical equipments or nodes 20 are surrounded by stress-relief devices 1, but only part of them or even one of them may be equipped with such stress-relief device 1 without departing from the scope of the disclosure.

During operation, it is quite easy and quick for an operator for mounting the stress-relief devices 1 around the geophysical equipments 20 or nodes, when necessary, with use of standard tools and not specific tools. It is not necessary to change the node or geophysical equipment or cables during operation, when the operation passes from a marsh zone to a transition zone. An embodiment of the disclosure is therefore time saving, for mounting or removing the stress-relief device 1.

The patentable scope of the subject matter is defined by the claims, and may include other examples that occur to those skilled in the art. Such other examples are intended to be within the scope of the claims.

The expression « comprising a » should be interpreted as being synonymous of the expression « comprising at least one », unless the contrary is specified.

An exemplary embodiment of the disclosure provides an external stress-relief device that protects geophysical equipment or node in a reliable manner especially in case of passage in a transition area, during operation.

An exemplary embodiment of the disclosure provides an external stress-relief device for transition areas that is inexpensive relative to the known device.

An exemplary embodiment of the disclosure provides an external stress-relief device that limits the problems due to the loops of the known system with ropes.

An exemplary embodiment of the disclosure provides an external stress-relief device that protects the geophysical equipment or node from bending stress.

An exemplary embodiment of the disclosure provides an external stress-relief device that improves the watertightness and robustness of the equipment.

An exemplary embodiment of the disclosure an external stress-relief device that prevents from damages of cables due to tightly encirclement in a point.

An exemplary embodiment of the disclosure provides an external stress-relief device that is compact in size and light.

Although the present disclosure has been described with reference to one or more examples, workers skilled in the art will recognize that changes may be made in form and detail without departing from the scope of the disclosure and/or the appended claims.

The invention claimed is:

1. A stress-relief device, configured for being mounted on a geophysical equipment or node connected to at least two cables, wherein the stress-relief device comprises :
   a case configured for surrounding the geophysical equipment or node and comprising first and second cable openings, each enabling a connection between a respective one of said at least two cables and said geophysical equipment or node, and
   a housing for housing a portion of each of the two cables, the housing being configured for substantially preventing any movement of said portions of the two cables, wherein the housing comprises opposing first and second lateral faces and defines a first cable path, which passes through the first lateral face, through an interior of the housing, through the second lateral face and then loops back through the first cable opening to make the connection with the geophysical equipment or node, and defines a second cable path, which passes through the second lateral face, through the interior of the housing, through the first lateral face and then loops back through the second cable opening to make the connection with the geophysical equipment or node, and wherein the housing is configured so that the first and second cable paths pass one another in the housing.

2. The stress-relief device according to claim 1, wherein the first and second lateral faces each comprises at least one cable opening to enable the at least two cables to pass through and are positioned so that the two cables are spaced enough between one another to allow the cables to go through the housing being parallel to one another and coming from opposite directions.

3. The stress-relief device according to claim 1, wherein the housing comprises at least one pipe, each pipe comprising two ends and being opened at its ends, each pipe being configured for housing at least one of said portions of the two cables.

4. The stress-relief device according to claim 1, wherein the housing comprises at least one soft piece for surrounding at least part of at least one of said portions of the two cables, the hardness of said at least one soft piece being lower than 80 Shore A, at room temperature.

5. The stress-relief device according to claim 1, wherein the case comprises a lower face, wherein the housing comprises said lower face or is disposed under said lower face.

6. The stress-relief device according to claim 5, wherein the housing comprises at least one plate fixable to said lower face of the case.

7. The stress-relief device according to claim 5, wherein the housing comprises at least one plate forming the lower face of the case.

8. The stress-relief device according to claim 1, wherein the device is removable from the geophysical equipment or node and from each of the at least two cables.

9. The stress-relief device according to claim 1, comprising at least one bend restrictor to be positioned around another portion of one of the two cables so as to prevent said another portion from bending, the at least one bend restrictor being in particular positioned around said another portion of one of the cables outside the housing in a vicinity of a respective one of the first and second lateral faces of the housing.

10. The stress-relief device according to claim 1, wherein the case comprises at least two half-shells to be mounted together around the geophysical equipment or node.

11. The stress-relief device according to claim 10, wherein the two half-shells are substantially symmetrical relative to a plane.

12. The stress-relief device according to claim 1, wherein the case comprises a passage enabling a connection between at least one third cable and said geophysical equipment or node.

13. An assembly comprising:
   at least two cables;
   a geophysical equipment or node; and
   a stress-relief device comprising:
      a case at least partially surrounding the geophysical equipment or node and comprising first and second cable openings, each enabling a connection between a respective one of said at least two cables and said geophysical equipment or node, and
      a housing for housing a portion of each of the two cables, the housing being configured for substantially preventing any movement of said portions of the two cables, wherein the housing comprises opposing first and second lateral faces, and wherein a first of the two cables passes through the first lateral face, through an interior of the housing, through the second lateral face and then loops back through the first cable opening to make the connection with the geophysical equipment or node, and wherein a second of the two cables passes through the second lateral face, through the interior of the housing, through the first lateral face and then loops back through the second cable opening to make the connection with the geophysical equipment or node, and wherein the housing is configured so that the first and second cables pass one another in the housing.

14. An acquisition line of seismic data comprising at least one assembly according to claim 13.

* * * * *